US012774534B2

(12) United States Patent
Sumiya et al.

(10) Patent No.: US 12,774,534 B2
(45) **Date of Patent: *Oct. 27, 2026**

(54) SYNTHETIC SINGLE CRYSTAL DIAMOND AND METHOD FOR PRODUCING THE SAME

(71) Applicant: SUMITOMO ELECTRIC INDUSTRIES, LTD., Osaka (JP)

(72) Inventors: Hitoshi Sumiya, Osaka (JP); Jin Hwa Lee, Osaka (JP); Minori Teramoto, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 147 days.

This patent is subject to a terminal disclaimer.

(21) Appl. No.: 18/568,957

(22) PCT Filed: May 2, 2022

(86) PCT No.: PCT/JP2022/019526

§ 371 (c)(1),
(2) Date: Dec. 11, 2023

(87) PCT Pub. No.: WO2022/264705

PCT Pub. Date: Dec. 22, 2022

(65) Prior Publication Data

US 2024/0287706 A1 Aug. 29, 2024

(30) Foreign Application Priority Data

Jun. 15, 2021 (JP) ................................ 2021-099432

(51) Int. Cl.
*C30B 29/04* (2006.01)
*C30B 9/10* (2006.01)
(Continued)

(52) U.S. Cl.
CPC ................ *C30B 29/04* (2013.01); *C30B 9/10* (2013.01); *C30B 33/02* (2013.01); *C30B 33/04* (2013.01)

(58) Field of Classification Search
CPC ........... C30B 29/04; C30B 9/10; C30B 33/02; C30B 33/04; C01B 32/25
See application file for complete search history.

(56) References Cited

U.S. PATENT DOCUMENTS 7,404,399 B2 7/2008 Sumiya et al.
11,613,826 B2 * 3/2023 Sumiya .................... B01J 3/062 51/307
(Continued)

FOREIGN PATENT DOCUMENTS

EP 3312311 A1 * 4/2018 ............ C01B 32/26
EP 3699330 A1 * 8/2020 ............ C30B 29/04
(Continued)

OTHER PUBLICATIONS

Ashfold et al., "Nitrogen in Diamond", Chemical Reviews, vol. 120, 2020, pp. 5745-5794.
(Continued)

*Primary Examiner* — Robert M Kunemund
(74) *Attorney, Agent, or Firm* — Renner, Otto, Boisselle & Sklar, LLP

(57) ABSTRACT

A synthetic single crystal diamond that includes nitrogen atoms at a concentration of 50 ppm or more and 1200 ppm or less in terms of number of atoms, wherein an infrared absorption spectrum of the synthetic single crystal diamond has an absorption signal within a wavenumber range of 1460 $cm^{-1}$ or more and 1470 $cm^{-1}$ or less.

9 Claims, 1 Drawing Sheet

(51) Int. Cl.
*C30B 33/02* (2006.01)
*C30B 33/04* (2006.01)

(56) References Cited

U.S. PATENT DOCUMENTS

| | | | |
|---|---|---|---|
| 2020/0062601 A1 | 2/2020 | Ikeda et al. |
| 2020/0283927 A1 | 9/2020 | Sumiya et al. |
| 2020/0325596 A1 | 10/2020 | Sumiya et al. |

FOREIGN PATENT DOCUMENTS

| | | | |
|---|---|---|---|
| JP | H0218980 A | 1/1990 |
| JP | 2021-099432 A | 7/2021 |
| WO | 2017198662 A1 | 11/2017 |
| WO | 2019/077844 A1 | 4/2019 |
| WO | 2019/077888 A1 | 4/2019 |

OTHER PUBLICATIONS

Collins, "Vacancy Enhanced Aggregation of Nitrogen in Diamond", Journal of Physics C: Solid State Physics, vol. 13, No. 14, May 20, 1980, pp. 2641-2650.
Non-Final Office Action received for U.S. Appl. No. 18/009,728, mailed on Sep. 10, 2025, 15 pages.
Notice of Allowance received for U.S. Appl. No. 18/009,728, mailed on Dec. 22, 2025, 7 pages.
Corrected Notice of Allowance received for U.S. Appl. No. 18/009,728, mailed on Mar. 24, 2026, 7 pages.
Restriction Requirement received for U.S. Appl. No. 18/009,728, mailed on Jun. 20, 2025, 7 pages.
U.S. Appl. No. 18/009,728, filed Dec. 11, 2022, 39 pages.
Non-Final Office Action issued Apr. 22, 2026, for co-pending U.S. Appl. No. 18/009,728.
Notice of Allowance for corresponding U.S. Appl. No. 18/009,728 dated Jul. 29, 2026.

* cited by examiner

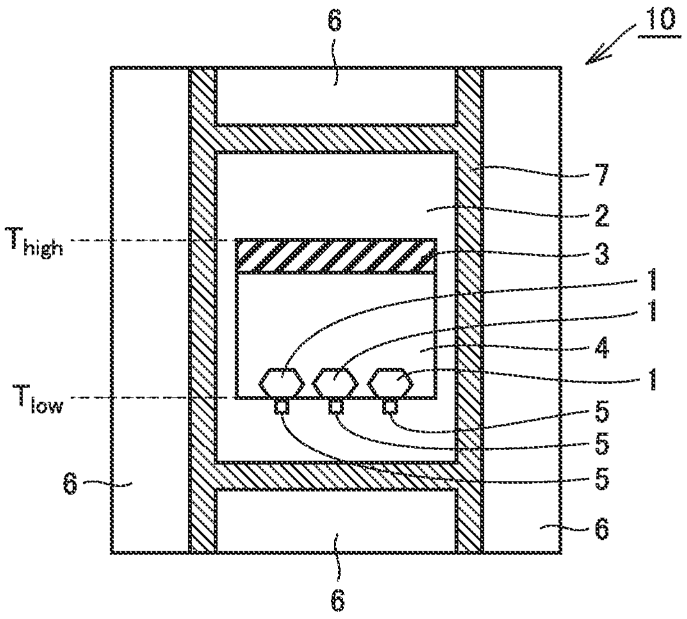
10
6
7
2
$T_{high}$
3
1
1
4
1
$T_{low}$
5
5
5
6
6
6

SYNTHETIC SINGLE CRYSTAL DIAMOND AND METHOD FOR PRODUCING THE SAME

TECHNICAL FIELD

The present disclosure relates to a synthetic single crystal diamond and a method for manufacturing the same. The present application claims a priority based on Japanese Patent Application No. 2021-099432, filed on Jun. 15, 2021. The content described in the Japanese Patent Application is entirely incorporated by reference herein.

BACKGROUND ART

Since single crystal diamonds are extremely hard, they are industrially used for: cutting tools such as a bit for precision cutting and processing and a cutter for woodworking; wear-resistant tools such as a dresser for grindstone, a die for delineation, a scribing tool, an orifice for water jet, and a wire guide; and other wide applications.

Many naturally produced single crystal diamonds (hereinafter, also referred to as "natural diamond") contain a nitrogen impurity as an aggregated impurity at a concentration of approximately several hundred to several thousand ppm (Ia type). The natural diamond has largely ununiform distribution of its impurity due to complex thermal history in generation inside the Earth, and has unevenness. In addition, the natural diamond contains many internal distortions and various crystal defects inside the crystal due to stress and various changes in heat applied during growth of the natural diamond. Thus, there is large variation of important mechanical characteristics for the tool, such as hardness and strength, even in the crystal. There is also large individual difference, and unstable quality and tool performance.

A part of the natural diamonds is a high-purity product that contains the nitrogen impurity at a concentration of several ppm or less (IIa type). However, such a natural diamond has many internal distortions and defects, and is unsuitable for the tool application.

As noted above, the natural diamond contains wide variety of internal distortions and structural defects, and the crystals are needed to be carefully selected for the industrial use. In addition, the natural diamond has large risks of change in cost and unstable supply.

On the other hand, synthetic single crystal diamonds artificially produced under high pressure at high temperature are synthesized under conditions of constant pressure and temperature, and thereby products with the same quality can be stably supplied. Therefore, the synthetic single crystal diamond is much superior to the natural diamond in industrial applications since it is smaller in variation of quality.

However, a nitrogen impurity is typically contained in the synthetic diamond at a concentration of about 100 ppm as isolated substitutional (dispersing) (Ib type), leading to deterioration of hardness and strength. Thus, use of such a synthetic diamond as the cutting tool tends to cause insufficient lifetime of the tool.

SUMMARY OF INVENTION

A synthetic single crystal diamond of the present disclosure is a synthetic single crystal diamond comprising nitrogen atoms at a concentration of 50 ppm or more and 1200 ppm or less in terms of number of atoms, wherein an infrared absorption spectrum of the synthetic single crystal diamond has an absorption signal within a wavenumber range of 1460 $cm^{-1}$ or more and 1470 $cm^{-1}$ or less.

A method for manufacturing the synthetic single crystal diamond of the present disclosure is a method for manufacturing the above synthetic single crystal diamond, the method comprising:

a first step of synthesizing a diamond single crystal that contains nitrogen atoms at a concentration of 50 ppm or more and 1200 ppm or less in terms of number of atoms by a temperature-difference method that uses a solvent metal;

a second step of irradiating the diamond single crystal with one or both of electron beam and particle beam to apply energy of 10 MGy or more and 1000 MGy or less; and a third step of performing heat treatment on the diamond single crystal after the second step in an inert gas at a pressure of 1 Pa or more and 100 kPa or less to obtain the synthetic single crystal diamond, wherein a temperature "x" in the heat treatment in the third step is 1400° C. or more and 1800° C. or less, a heating time "y" is 1 minute or more and 360 minutes or less, and the temperature "x" ° C. and the heating time "y" minutes satisfy the following Formula 1, $$-0.0725x+132 \le y \le -0.75x+1410. \qquad \text{Formula 1}$$

BRIEF DESCRIPTION OF DRAWINGS

FIG. 1 is a schematic sectional view that illustrates an example of constitution of a sample chamber used for manufacturing a synthetic single crystal diamond according to an embodiment of the present disclosure.

DETAILED DESCRIPTION

Problem to be Solved by the Present Disclosure

With the recent demand of longer lifetime of the tools, a synthetic single crystal diamond that has high hardness in order to improve wear resistance of the tool has been required.

Accordingly, an object of the present disclosure is to provide the synthetic single crystal diamond that has high hardness.

Advantageous Effect of the Present Disclosure

The synthetic single crystal diamond of the present disclosure has high hardness.

DESCRIPTION OF EMBODIMENTS

First, embodiments of the present disclosure will be listed and described.

(1) A synthetic single crystal diamond of the present disclosure is a synthetic single crystal diamond, comprising nitrogen atoms at a concentration of 50 ppm or more and 1200 ppm or less in terms of number of atoms, wherein an infrared absorption spectrum of the synthetic single crystal diamond has an absorption signal within a wavenumber range of 1460 $cm^{-1}$ or more and 1470 $cm^{-1}$ or less.

The synthetic single crystal diamond of the present disclosure has high hardness.

(2) An absorption intensity IA of the absorption signal is preferably 0.1% or more of an absorption intensity IB at a wavenumber of 2160 $cm^{-1}$ in the infrared absorption spectrum.

According to this, wear resistance and breakage resistance of the synthetic single crystal diamond are improved.

(3) A Raman shift λ1 $cm^{-1}$ of a peak in a first-order Raman scattering spectrum of the synthetic single crystal diamond and a Raman shift λ2 $cm^{-1}$ of a peak in a first-order Raman scattering spectrum of a synthetic IIa-type single crystal diamond that has a concentration of nitrogen atoms of 1 ppm or less in terms of number of atoms preferably exhibit a relationship of the following Formula A, $$\lambda 1-\lambda 2 \geq -0.15. \qquad \text{Formula A}$$

According to this, an internal stress state of the synthetic single crystal diamond becomes appropriate, and breakage resistance of the synthetic single crystal diamond is improved.

(4) A Knoop hardness in a <100> direction on a {001} plane of the synthetic single crystal diamond is preferably 95 GPa or more, and the Knoop hardness is measured in accordance with JIS Z 2251:2009 under conditions of a temperature of 23° C.±5° C. and a test load of 4.9 N. Here, the temperature of 23° C.±5° C. means a temperature of 18° C. or more and 28° C. or less.

According to this, a hardness of the synthetic single crystal diamond is improved and wear resistance is improved.

(5) The synthetic single crystal diamond preferably contains no isolated substitutional nitrogen atom.

According to this, an internal stress state of the synthetic single crystal diamond becomes appropriate, and breakage resistance of the synthetic single crystal diamond is improved.

(6) The synthetic single crystal diamond preferably comprises the nitrogen atoms within a range of 80 ppm or more and 1100 ppm or less in terms of number of atoms.

According to this, wear resistance and breakage resistance of the synthetic single crystal diamond are improved.

(7) A method for manufacturing a synthetic single crystal diamond of the present disclosure is a method for manufacturing the above synthetic single crystal diamond, the method comprising:

- a first step of synthesizing a diamond single crystal that contains nitrogen atoms at a concentration of 50 ppm or more and 1200 ppm or less in terms of number of atoms by a temperature-difference method that uses a solvent metal,
- a second step of irradiating the diamond single crystal with one or both of electron beam and particle beam to apply energy of 10 MGy or more and 1000 MGy or less; and
- a third step of performing heat treatment on the diamond single crystal after the second step in an inert gas at a pressure of 1 Pa or more and 100 kPa or less to obtain the synthetic single crystal diamond,
- wherein a temperature "x" in the heat treatment in the third step is 1400° C. or more and 1800° C. or less, a heating time "y" is 1 minute or more and 360 minutes or less, and the temperature "x" ° C. and the heating time "y" minutes satisfy the following Formula 1, $$-0.0725x+132 \leq y \leq -0.75x+1410. \qquad \text{Formula 1}$$

According to this, the synthetic single crystal diamond that has high hardness can be obtained.

(8) The solvent metal preferably contains cobalt. According to this, the infrared absorption spectrum of the obtained synthetic single crystal diamond easily has the absorption signal within the range of a wavenumber of 1460 $cm^{-1}$ or more and 1470 $cm^{-1}$ or less.

DETAILED DESCRIPTION OF EMBODIMENTS

A specific example of the synthetic single crystal diamond of the present disclosure will be described hereinafter with reference to the drawings. In the drawings of the present disclosure, a same reference sign represents same parts or corresponding parts. A size relationship of length, width, thickness, depth, and the like is appropriately modified for clarify and simplify the drawings, and not necessarily illustrates an actual size relationship.

The description form "A to B" herein means an upper limit and lower limit of the range (that is, A or more and B or less). When there is no description on a unit of A and only a unit of B is described, the unit of A and the unit of B are same.

Herein, a generic plane orientation that includes crystal-geometrically equivalent plane orientations is represented by { }, and a generic direction that includes crystal-geometrically equivalent directions is represented by < >.

When one or more values are each described in the present disclosure as lower limits of numerical ranges and upper limits of numerical ranges, combinations of any one value described as a lower limit and any one value described as an upper limit are also disclosed. For example, when a1 or more, b1 or more, and c1 or more are described as lower limits, and when a2 or less, b2 or less, and c2 or less are described as upper limits, disclosed are a1 or more and a2 or less, a1 or more and b2 or less, a1 or more and c2 or less, b1 or more and a2 or less, b1 or more and b2 or less, b1 or more and c2 or less, c1 or more and a2 or less, c1 or more and b2 or less, and c1 or more and c2 or less.

Embodiment 1: Synthetic Single Crystal Diamond

A synthetic single crystal diamond of the present embodiment is a synthetic single crystal diamond comprising nitrogen atoms at a concentration of 50 ppm or more and 1200 ppm or less in terms of number of atoms, wherein an infrared absorption spectrum of the synthetic single crystal diamond has an absorption signal within a wavenumber range of 1460 $cm^{-1}$ or more and 1470 $cm^{-1}$ or less.

The synthetic single crystal diamond of the present embodiment has high hardness. Furthermore, the synthetic single crystal diamond of the present embodiment can have excellent wear resistance and breakage resistance. The reason is unclear, but presumed as the following (i) and (ii).

(i) The synthetic single crystal diamond of the present embodiment contains nitrogen atoms at a concentration of 50 ppm or more and 1200 ppm or less in terms of number of atoms. According to this, the nitrogen atoms in the synthetic single crystal diamond easily aggregate each other to form an aggregate. Since the aggregate that contains nitrogen atoms inhibits development of cracking and plastic deformation that occur when a load is applied to the synthetic single crystal diamond, this synthetic single crystal diamond can have excellent breakage resistance.

(ii) The infrared absorption spectrum of the synthetic single crystal diamond of the present embodiment has the absorption signal within a wavenumber range of 1460 $cm^{-1}$ or more and 1470 $cm^{-1}$ or less. A detail of this absorption signal is unclear, but is presumably derived from a kind of an impurity in which the aggregate of a plurality of nitrogen impurities is contained between crystal lattices.

The present inventors have newly found that the synthetic single crystal diamond that exhibits the absorption signal within a wavenumber range of 1460 $cm^{-1}$ or more and 1470 $cm^{-1}$ or less has high hardness, high strength, and excellent wear resistance and breakage resistance. This synthetic single crystal diamond is considered to contain the aggregates formed by bonding a plurality of nitrogen atoms (N—N bond) between its crystal lattices. When the synthetic single crystal diamond contains this aggregate, development of cleavage cracking and sliding deformation in a (111) plane to cause breakage and plastic deformation of the single crystal diamond is inhibited by this aggregate, and mechanical properties of the synthetic single crystal diamond, such as hardness and strength, and wear resistance and breakage resistance, are presumed to be improved.

<Nitrogen-Atom Concentration>

The synthetic single crystal diamond of the present embodiment contains nitrogen atoms at a concentration of 50 ppm or more and 1200 ppm or less in terms of number of atoms (hereinafter, the concentration of nitrogen atoms in terms of number of atoms is also referred to as "nitrogen-atom concentration"). When the nitrogen-atom concentration is 50 ppm or more, the nitrogen atoms in the synthetic single crystal diamond easily form the aggregate that contains the nitrogen atoms. When the nitrogen-atom concentration is 1200 ppm or less, the synthetic single crystal diamond can have high hardness and excellent wear resistance and breakage resistance.

A lower limit of the nitrogen-atom concentration in the synthetic single crystal diamond is 50 ppm or more, preferably 60 ppm or more, preferably 80 ppm or more, and more preferably 100 ppm or more from the viewpoint of ease of formation of the aggregate that contains nitrogen atoms. On the other hand, excessive aggregates become a factor of deterioration of hardness of the synthetic single crystal diamond. From this viewpoint, an upper limit of the nitrogen-atom concentration in the synthetic single crystal diamond is 1200 ppm or less, preferably 1100 ppm or less, and more preferably 1000 ppm or less. The nitrogen-atom concentration in the synthetic single crystal diamond is 50 ppm or more and 1200 ppm or less, preferably 60 ppm or more and 1200 ppm or less, more preferably 80 ppm or more and 1100 ppm or less, and further preferably 100 ppm or more and 1000 ppm or less.

The nitrogen-atom concentration in the synthetic single crystal diamond can be measured by secondary ion mass spectrometry (SIMS).

As long as an identical sample is measured, a plurality of times of the measurement with changing a selected position of the measurement region yields little variation of the measurement results, and it has been confirmed that randomly setting the measurement regions does not become arbitrary.

<Infrared Absorption Spectrum>

The infrared absorption spectrum of the synthetic single crystal diamond of the present embodiment has the absorption signal within a wavenumber range of 1460 $cm^{-1}$ or more and 1470 $cm^{-1}$ or less. Since this synthetic single crystal diamond contains the aggregate formed by bonding a plurality of nitrogen atoms (N—N bond) between its crystal lattices, it is presumed that development of plastic deformation and cleavage cracking due to external stress is inhibited by this aggregate, and the mechanical properties, such as hardness and strength, and wear resistance and breakage resistance are improved.

The infrared absorption spectrum herein is obtained by measurement with Fourier-transform infrared spectrometry at a temperature of 23° C.±2° C. Here, the temperature of 23° C.±2° C. means a temperature of 21° C. or more and 25° C. or less. The measurement procedure is as follows. First, the synthetic single crystal diamond being a measurement sample is processed into a plate with approximately 1 mm in thickness, two surfaces to transmit light are polished with a metal-bonded grindstone so that a surface roughness Ra is 20 nm or less. The polished surface is irradiated with infrared ray to produce the infrared absorption spectrum.

The infrared absorption spectrum of the synthetic single crystal diamond that has the absorption signal within a wavenumber range of 1460 $cm^{-1}$ or more and 1470 $cm^{-1}$ or less can be confirmed on an absorption spectrum chart. The infrared absorption spectrum of the synthetic single crystal diamond that has the absorption signal within a wavenumber range of 1460 $cm^{-1}$ or more and 1470 $cm^{-1}$ or less means that the maximum value of the absorption signal is present within a wavenumber range of 1460 $cm^{-1}$ or more and 1470 $cm^{-1}$ or less on the absorption spectrum chart (horizontal axis: wavenumber ($cm^{-1}$), vertical axis: absorbance or absorption rate) of the synthetic single crystal diamond. When the peak that indicates the absorption signal is small and difficult to determine presence or absence of the absorption signal, the spectrum chart can be magnified to determine presence or absence of the absorption signal.

In the infrared absorption spectrum of the synthetic single crystal diamond of the present embodiment, an absorption intensity IA of the absorption signal within a wavenumber range of 1460 $cm^{-1}$ or more and 1470 $cm^{-1}$ or less is preferably 0.1% or more of an absorption intensity IB at a wavenumber of 2160 $cm^{-1}$ of the infrared absorption spectrum. The absorption peak at a wavenumber of 2160 $cm^{-1}$ in the infrared absorption spectrum of the synthetic single crystal diamond is derived from absorption of phonon of the diamond itself. When the absorption intensity IA is 0.1% or more of the absorption intensity IB, generation and development of cleavage and/or plastic deformation are inhibited by the aggregate formed between crystal lattices, and thereby wear resistance and breakage resistance of the synthetic single crystal diamond are improved.

A lower limit of the percentage of the absorption intensity IA relative to the absorption intensity IB is preferably 0.1% or more, preferably 0.2% or more, preferably 0.3% or more, preferably 0.4% or more, and preferably 0.7% or more from the viewpoint of improvement of wear resistance and breakage resistance of the synthetic single crystal diamond. An upper limit of the percentage of the absorption intensity IA relative to the absorption intensity IB is preferably 30% or less, preferably 20% or less, preferably 10% or less, and preferably 7.9% or less from the viewpoint of prevention of decreases in wear resistance and/or breakage resistance due to excessive aggregates. The percentage of the absorption intensity IA relative to the absorption intensity IB is preferably 0.1% or more and 30% or less, preferably 0.2% or more and 20% or less, preferably 0.3% or more and 10% or less, and preferably 0.1% or more and 7.9% or less. The percentage of the absorption intensity IA relative to the absorption intensity IB can be calculated by the formula (IA/IB) ×100.

It has been confirmed that presence or absence of the absorption signal within a wavenumber range of 1460 $cm^{-1}$ or more and 1470 $cm^{-1}$ or less, and the percentage of the absorption intensity IA relative to the absorption intensity IB have no variation even with freely changing the aforementioned infrared ray irradiation region on the identical synthetic single crystal diamond.

<Raman Spectrum>

A Raman shift A1 $cm^{-1}$ of a peak in a first-order Raman scattering spectrum of the synthetic single crystal diamond of the present embodiment and a Raman shift λ2 $cm^{-1}$ of a peak in a first-order Raman scattering spectrum of a synthetic IIa-type single crystal diamond that has a concentration of nitrogen atoms of 1 ppm or less in terms of number of atoms preferably exhibit a relationship of the following Formula A, $$\lambda 1-\lambda 2 \geq -0.15. \quad \text{Formula A}$$

A state of internal stress in the synthetic single crystal diamond is an indicator of breakage resistance. The state of the internal stress of the synthetic single crystal diamond can be evaluated by comparing the Raman shift λ1 $cm^{-1}$ of the peak in the first-order Raman scattering spectrum of the synthetic single crystal diamond and the Raman shift λ2 $cm^{-1}$ of the peak in the first-order Raman scattering spectrum of a synthetic IIa-type single crystal diamond that has a concentration of nitrogen atoms of 1 ppm or less in terms of number of atoms (hereinafter, also referred to as the reference sample or the synthetic Ha-type single crystal diamond). Specifically, the state of the internal stress of the single crystal diamond can be evaluated with a size of a peak position shift amount represented by the difference between λ1 and λ2 (λ1−λ2). The reason will be described below.

The synthetic IIa-type single crystal diamond used as the reference sample means a synthetic single crystal diamond, which is synthesized by a temperature-difference method at high temperature and high pressure, is highly pure and contains no lattice defect nor internal distortion. For example, such a synthetic single crystal diamond is commercially available as a highly pure IIa-type single crystal diamond manufactured by Sumitomo Electric Industries, Ltd. The synthetic IIa-type single crystal diamond has a concentration of nitrogen atoms in terms of number of atoms of 1 ppm or less, more specifically 0 ppm or more and 1 ppm or less, and thus contains few nitrogen atoms, and thereby the internal stress is absent in the diamond crystal. The synthetic IIa-type single crystal diamond exhibits one sharp and intense peak in the first-order Raman scattering spectrum. The Raman shift of this peak typically appears within a range of 1332 $cm^{-1}$ to 1333 $cm^{-1}$. The value of the Raman shift varies depending on an environment temperature during the measurement. The Raman shift herein is a value measured at a temperature of 23° C.±2° C. Here, the temperature of 23° C.±2° C. means a temperature of 21° C. or more and 25° C. or less.

When isolated substitutional nitrogen atoms are present in the diamond crystal, the Raman shift occurs on a lower frequency side than that of the synthetic Ha-type single crystal diamond. In this case, tensile stress derived from the isolated substitutional nitrogen atoms is generated in the diamond crystal. On the other hand, the isolated substitutional nitrogen atoms are absent and an aggregation-type nitrogen atoms are present in the diamond crystal, the Raman shift shifts onto a higher frequency side than that of the synthetic IIa-type single crystal diamond. In this case, tensile stress is not generated or compressive stress is generated in the diamond crystal.

Therefore, the state of the internal stress of the synthetic single crystal diamond can be evaluated by comparing the values of the Raman shift λ1 $cm^{-1}$ of the synthetic single crystal diamond and the Raman shift λ2 $cm^{-1}$ of the synthetic IIa-type single crystal diamond.

The present inventors have made intensive investigation on a relationship between the size of the peak position shift amount represented by the difference between λ1 $cm^{-1}$ and λ2 $cm^{-1}$ (λ1−λ2) $cm^{-1}$ and distortion of the synthetic single crystal diamond based on the above findings, and consequently found that the internal stress state of the synthetic single crystal diamond becomes appropriate to yield excellent breakage resistance when the (λ1−λ2) $cm^{-1}$ exhibits a relationship of the following Formula A.

$$\lambda 1-\lambda 2 \geq -0.15. \quad \text{Formula A}$$

A lower limit of the (λ1−λ2) $cm^{-1}$ is preferably −0.15 or more, −0.14 or more, −0.13 or more, −0.12 or more, or −0.10 or more. An upper limit of the (λ1−λ2) $cm^{-1}$ is preferably 1.0 or less, 0.9 or less, 0.8 or less, 0.7 or less, or 0.1 or less. The (λ1−λ2) $cm^{-1}$ is preferably −0.15 or more and 1.0 or less, more preferably −0.14 or more and 0.9 or less, further preferably −0.13 or more and 0.8 or less, and further preferably −0.12 or more and 0.7 or less from the viewpoint of improvement of breakage resistance of the single crystal diamond.

The Raman shift λ1 of the peak in the first-order Raman scattering spectrum of the synthetic single crystal diamond is measured by the following procedure. First, a surface of the synthetic single crystal diamond being a measurement sample is polished with a metal-bonded grindstone so that Ra is 20 nm or less. The measurement sample is preferably mainly near square or octagonal. The polished surface is irradiated with laser under the following conditions to detect scattered Raman ray.

Measurement Conditions

- Measurement apparatus: LabRAM HR-800 (manufactured by HORIBA JOBIN YVON)
- Laser wavelength: 532 nm
- Laser irradiation position (measurement region): Raman ray is detected at the following five positions (a1) to (a5).
- (a1) is a central portion on the polished surface of the measurement sample (center of gravity position on the two-dimensional surface).
- (a2) A straight line is drawn from the central portion to an end portion of the polished surface, and a position P where a length of this straight line becomes maximum is specified. When a distance from the central portion to P is D1, (a2) is a position on the line from the central portion to P, and a distance from the central portion is ¾ D1.
- (a3) A straight line is drawn from the central portion in the opposite direction to P, and a crossing point Q between the straight line and an end portion of the polished surface is specified. That is, P, the central portion, and Q are present on the same straight line L1. When a distance from the central portion to Q is D2, (a3) is a position on the line from the central portion to Q, and a distance from the center portion is ¾ D2.

(a4) A straight line L2 that passes through the central portion and that crosses the straight line L1, which passes through the P, the central portion, and Q, at a right angle is drawn, and crossing points R and S of the straight line L2 and end portions of the polished surface are specified. When a distance from the central portion to R is D3 (a4) is a position on a line from the central portion to R, and a distance from the central portion is ¾ D3.

(a5) When a distance from the central portion to the S is D4, (a5) is a portion on a line from the central portion to S, and a distance from the central portion is ¾ D4.

Measurement temperature. 23° C.±2° C. When samples are measured, changes in temperature of the detector and optical system of the Raman spectrometer are suppressed within ±° C. or less.

Raman ray detected at each of the above five positions is subjected to spectrum analysis to measure the Raman shift of the peak in the first-order Raman scattering spectrum of the synthetic single crystal diamond of the present embodiment. This Raman shift is a wavenumber at which the first-order Raman scattering spectrum signal becomes most intense. The peak shape is evaluated by peak-fitting treatment with Lorentz function or Gaussian function. Among the above five Raman shifts, a weighted average of the Raman shift at the central portion and the Raman shift of each of the other four portions at a ratio of 4:1 is calculated. This weighted average is the Raman shift λ1 herein.

In the identical single crystal diamond, crystalline properties such as distortion of the sample can be uniquely evaluated by setting the measurement regions at the above five positions and the calculation method for its weighted average, and they can be compared between samples.

The Raman shift λ2 $cm^{-1}$ of the peak in the first-order Raman scattering spectrum of the highly pure synthetic Ha-type single crystal diamond, which is the reference sample, is also measured by the same method as for the aforementioned Raman shift λ1 $cm^{-1}$.

The value of (λ1−λ2) is calculated to obtain the peak position shift amount.

<{001}<100> Knoop Hardness>

A Knoop hardness in a <100> direction on {001} plane of the synthetic single crystal diamond of the present embodiment (also referred to as "{001}<100> Knoop hardness" herein) is preferably 95 GPa or more. The Knoop hardness is measured in accordance with JIS Z 2251:2009 under conditions of a temperature of 23° C.±5° C. and a test load of 4.9 N. Here, the temperature of 23° C.±5° C. means a temperature of 18° C. or more and 28° C. or less. The synthetic single crystal diamond has higher hardness than natural diamonds and excellent wear resistance.

A lower limit of the {001}<100> Knoop hardness of the synthetic single crystal diamond of the present embodiment is preferably 95 GPa or more, preferably 100 GPa or more, preferably 105 GPa or more, more preferably 110 GPa or more, and further preferably 115 GPa or more. An upper limit of the {001}<100> Knoop hardness is not particularly limited, but can be 130 GPa or less, for example, from the viewpoint of manufacture. The {001}<100> Knoop hardness of the synthetic single crystal diamond is preferably 95 GPa or more and 130 GPa or less, preferably 100 GPa or more and 130 GPa or less, preferably 105 GPa or more and 130 GPa or less, more preferably 110 GPa or more and 130 GPa or less, and further preferably 115 GPa or more and 130 GPa or less.

A method for evaluating the {001}<100> Knoop hardness (unit: GPa) will be described. The measurement of the Knoop hardness is known as an index that indicates a hardness of an industrial material as prescribed in JIS Z2251:2009, and a Knoop indenter is pressed against a material to be measured at a predetermined temperature and a predetermined load (test load) to determine the hardness of the material.

The {001}<100> Knoop hardness is determined by pressing the Knoop indenter in the <100> direction in the {001} plane of the synthetic single crystal diamond at a load of 4.9 N, then measuring a longer diagonal line "a" (μm) of a Knoop indentation formed on a surface of the synthetic single crystal diamond after the test load is released, and calculating the {001}<100> Knoop hardness with the following Formula B.

$$\{001\} < 100 > \text{Knoop hardness} = 14229 \times 4.9/a^2 \qquad \text{Formula B}$$

<Isolated Substitutional Nitrogen Atom>

When an isolated substitutional nitrogen impurity is contained in the single crystal diamond, local tensile stress in crystal lattices is typically generated around the nitrogen impurity, which triggers plastic deformation and breakage, and tends to deteriorate hardness, wear resistance, and breakage resistance. On the other hand, in a case of a highly pure crystal in which impurities such as nitrogen and boron are not contained in the single crystal diamond or in which a content of nitrogen and boron is extremely low, the single crystal diamond has high hardness but is weak against impact. In addition, when locally high load is applied by an external stress in some directions, cracking and plastic deformation along the {111} plane due to cleavage are likely to occur.

The synthetic single crystal diamond of the present embodiment preferably contains no isolated substitutional nitrogen atom. The present inventors have newly found that an isolated substitutional nitrogen atom contained in the diamond crystal generates local tensile stress in crystal lattices around the nitrogen atom, which triggers plastic deformation and breakage to deteriorate hardness, wear resistance, and breakage resistance. Based on this finding, the present inventors have found that no isolated substitutional nitrogen atom contained in the diamond crystal is preferable from the viewpoint of improvement of wear resistance and breakage resistance.

In the synthetic single crystal diamond that contains the isolated substitutional nitrogen atoms, a lone-pair electron derived from the nitrogen atom is present. Thus, a concentration of the isolated substitutional nitrogen atoms in terms of number of atoms in the synthetic single crystal diamond can be measured by electron spin resonance (ESR) analysis. The ESR detects a signal of not only the isolated substitutional nitrogen atoms but also crystal defects that have a lone-pair electron, and the like. In this case, the isolated substitutional nitrogen atoms can be separately detected with a g-value or a relaxation time of the signal.

The synthetic single crystal diamond that contains no isolated substitutional nitrogen atom can be confirmed by an infrared absorption spectrum measured by Fourier-transform infrared spectrometry. Specifically, when an absorption peak is absent within a wavenumber range of 1130±2 $cm^{-1}$ in the infrared absorption spectrum, the synthetic single crystal diamond is determined to contain no isolated substitutional nitrogen atom. The wavenumber range of 1130±2 $cm^{-1}$ means a wavenumber of 1128 $cm^{-1}$ or more and 1132 $cm^{-1}$ or less.

When a shoulder is present within the range of the wavenumber of 1130±2 $cm^{-1}$ in the infrared absorption spectrum and whether this shoulder is the absorption peak derived from the isolated substitutional nitrogen atom is unclear, the presence or absence of the isolated substitutional nitrogen atom can be determined by ESR analysis. When the isolated substitutional nitrogen atom is absent in the synthetic single crystal diamond, a lone-pair electron is absent in the single crystal diamond. Therefore, no signal is detected by ESR analysis on such a single crystal diamond. According to this, the absence of the isolated substitutional nitrogen atom in the synthetic single crystal diamond can be confirmed.

Embodiment 2: Method for Manufacturing Synthetic Single Crystal Diamond

An example of a method for manufacturing the synthetic single crystal diamond of Embodiment 1 will be described hereinafter.

A method for manufacturing a synthetic single crystal diamond of the present embodiment is a method for manufacturing the synthetic single crystal diamond of Embodiment 1, the method comprising:

- a first step of synthesizing a diamond single crystal that contains nitrogen atoms at a concentration of 50 ppm or more and 1200 ppm or less in terms of number of atoms by a temperature-difference method that uses a solvent metal;
- a second step of irradiating the diamond single crystal with one or both of electron beam and particle beam to apply energy of 10 MGy or more and 1000 MGy or less; and
- a third step of performing heat treatment on the diamond single crystal after the second step in an inert gas at a pressure of 1 Pa or more and 100 kPa or less to obtain the synthetic single crystal diamond,
- wherein a temperature "x" in the heat treatment in the third step is 1400° C. or more and 1800° C. or less, a heating time "y" is 1 minute or more and 360 minutes or less, and the temperature "x" ° C. and the heating time "y" minutes satisfy the following Formula 1, $$-0.0725x+132 \leq y \leq -0.75x+1410. \quad \text{Formula 1}$$

(First Step)

The diamond single crystal can be produced by the temperature-difference method by using a sample chamber that has constitution illustrated in FIG. 1, for example.

As illustrated in FIG. 1, in a sample chamber 10 used for manufacturing a diamond single crystal 1, an insulator 2, a carbon source 3, a solvent metal 4, and a seed crystal 5 are disposed in a space surrounded by a graphite heater 7, and a pressure medium 6 is disposed outside graphite heater 7. The temperature-difference method is a synthesis method in which a temperature gradient is provided inside sample chamber 10 in a vertical direction, carbon source 3 is disposed in a high-temperature portion (T high), seed crystal 5 of diamond is disposed in a low-temperature portion (T low), solvent metal 4 is interposed between carbon source 3 and seed crystal 5, and diamond single crystal 1 is grown on seed crystal 5 by holding conditions of a temperature equal to or higher than a temperature at which this solvent metal 4 is melted and a pressure equal to or higher than a pressure at which diamond is thermally stable. For example, the pressure in the sample chamber is regulated within a range of 5.0 to 6.0 GPa, the temperature of the low-temperature portion is regulated within a range of 1360° C. to 1380° C., and such conditions are held for 50 to 200 hours to grow the diamond single crystal on the seed crystal.

As carbon source 3, a diamond powder is preferably used. Graphite and pyrolyzed carbon can also be used. As solvent metal 4, one or more metals selected from iron (Fe), cobalt (Co), nickel (Ni), manganese (Mn), and the like, or alloys that contain these metals can be used. Solvent metal 4 is preferably metal that contains cobalt. In an infrared absorption spectrum of a synthetic single crystal diamond produced by using a solvent metal that contains no cobalt or a solvent metal that has a small content of cobalt as the solvent metal, the absorption signal may not be observed within a wavenumber range of 1460 $cm^{-1}$ or more and 1470 $cm^{-1}$ or less. As the solvent metal, iron-cobalt alloy or iron-nickel-cobalt alloy is preferably used.

Into carbon source 3 or solvent metal 4, a nitride such as iron nitride ($Fe_2N$ and $Fe_3N$), aluminum nitride (AlN), phosphorus nitride ($P_3N_4$), or silicon nitride ($Si_3N_4$), or an organic nitrogen compound such as melamine or sodium azide can be added as a single substance or a mixture as a nitrogen source, for example. As the nitrogen source, diamond, graphite, or carbonitride (CN) compound that contains a large amount of nitrogen may also be added. This addition enables the diamond single crystal to be synthesized to contain nitrogen atoms. In this case, the nitrogen atoms in the diamond single crystal are present mainly as the isolated substitutional nitrogen atoms.

A content of the nitrogen source in carbon source 3 or solvent metal 4 is regulated so that the concentration of the nitrogen atoms in the diamond single crystal to be synthesized is 50 ppm or more and 1200 ppm or less. For example, with the carbon source, the concentration of the nitrogen atoms in terms of number of atoms derived from the nitrogen source can be set to 200 ppm or more and 3000 ppm or less. With the solvent metal, the content of the nitrogen source can be set to, for example, 0.01 mass % or more and 0.2 mass % or less when the metal solvent is an alloy composed of iron-cobalt-nickel and the nitrogen source is $Fe_3N$.

Solvent metal 4 may further contain one or more elements selected from the group consisting of titanium (Ti), vanadium (V), chromium (Cr), manganese (Mn), copper (Cu), zirconium (Zr), niobium (Nb), molybdenum (Mo), ruthenium (Ru), rhodium (Rh), hafnium (Hf), tantalum (Ta), tungsten (W), Osmium (Os), Iridium (Ir), and platinum (Pt).

(Second Step)

Then, the obtained diamond single crystal is irradiated with any one or both of electron beam and particle beam to apply energy of 10 MGy or more and 1000 MGy or less. This irradiation introduces lattice defects in the diamond single crystal to form vacancies.

If an amount of the irradiation energy is less than 10 MGy, the introduction of the lattice defects may be insufficient. On the other hand, if the energy amount exceeds 1000 MGy, excessive vacancies may be generated to considerably deteriorate crystallinity. Therefore, the energy amount is preferably 10 MGy or more and 1000 MGy or less.

As the particle beam, neutron beam or proton beam can be used. Irradiation conditions are not particularly limited as long as the energy of 10 MGy or more and 1000 MGy or less can be applied to the diamond single crystal. For example, when electron beam is used, an irradiation energy can be 4.6 MeV or more and 4.8 MeV or less, a current can be 2 mA or more and 5 mA or less, and an irradiation time can be 30 hours or more and 45 hours or less.

(Third Step)

Then, the heat treatment is performed on the diamond single crystal after the second step in an inert gas at a pressure of 1 Pa or more and 100 kPa or less to obtain the synthetic single crystal diamond. The temperature "x" of the heat treatment in the third step is 1400° C. or more and 1800° C. or less, the heating time "y" is 1 minute or more and 360 minutes or less, and the temperature "x" ° C. and the heating time "y" minutes satisfy the following Formula 1, $$-0.0725x+132 \leq y \leq -0.75x+1410. \quad \text{Formula 1}$$

By the heat treatment in the third step, the isolated substitutional nitrogen atoms in the diamond single crystal move through the vacancies to aggregate, and form the aggregation-type nitrogen atoms. The term "in the inert gas" herein means "in an inert gas atmosphere such as nitrogen and argon gas".

When the temperature "x" in the heat treatment in the third step is 1400° C. or more, it is presumed that the move of the nitrogen atoms in the diamond single crystal is promoted, and formation of the aggregate formed by bonding a plurality of nitrogen atoms (N—N bonds) is promoted. If the temperature in the third step is less than 1400° C., the aggregate is difficult to form. An upper limit of the temperature "x" is 1800° C. or less from the viewpoint of prevention of a decrease in the aggregates or graphitization of the diamond.

When the heating time "y" of the heat treatment in the third step is 1 minute or more, the move of the nitrogen atoms in the diamond single crystal is promoted, and formation of the aggregate formed by bonding a plurality of nitrogen atoms (N—N bonds) is promoted. An upper limit of the heating time "y" is 360 minutes or less from the viewpoint of prevention of a decrease in the aggregates or graphitization of the diamond.

The temperature "x" ° C. and the heating time "y" minutes in the third step satisfy the following Formula 1.

$$-0.0725x+132 \leq y \leq -0.75x+1410 \quad \text{Formula 1}$$

According to this, the move of nitrogen atoms in the diamond single crystal is promoted, formation of the aggregates is further promoted, and the synthetic single crystal diamond that has further high strength and hardness can be obtained. The heat treatment under the conditions of the above formula does not cause graphitization of the diamond single crystal and an increase in internal distortions due to crystal defects.

The second step and the third step can be repeated with about two cycles where each of the steps being performed once is defined as one cycle. This promotes the aggregation of the isolated substitutional nitrogen atoms in the diamond single crystal, and formation of the aggregates formed by bonding a plurality of nitrogen atoms (N—N bonds) is promoted. However, excessive repetition may cause a decrease in the aggregates depending on the temperature condition.

[Supplement 1]

The synthetic single crystal diamond of the present disclosure preferably contains nitrogen atoms at 60 ppm or more and 1200 ppm or less in terms of number of atoms.

The synthetic single crystal diamond of the present disclosure preferably contains nitrogen atoms at 80 ppm or more and 1100 ppm or less in terms of number of atoms.

[Supplement 2]

The infrared absorption spectrum of the synthetic single crystal diamond of the present disclosure is obtained by measurement at a temperature of 23° C.±2° C. with Fourier-transform infrared spectrometry.

[Supplement 3]

In the synthetic single crystal diamond of the present disclosure, the percentage of the absorption intensity IA relative to the absorption intensity IB is preferably 0.1% or more and 30% or less.

In the synthetic single crystal diamond of the present disclosure, the percentage of the absorption intensity IA relative to the absorption intensity IB is preferably 0.2% or more and 20% or less.

[Supplement 4]

In the synthetic single crystal diamond of the present disclosure, the ($\lambda 1-\lambda 2$) $cm^{-1}$ is preferably −0.15 or more and 1.0 or less.

In the synthetic single crystal diamond of the present disclosure, the ($\lambda 1-\lambda 2$) $cm^{-1}$ is preferably −0.14 or more and 0.9 or less.

[Supplement 5]

In the method for manufacturing the synthetic single crystal diamond of the present disclosure, a diamond powder is preferably used as the carbon source in the first step.

[Supplement 6]

In the method for manufacturing the synthetic single crystal diamond of the present disclosure, iron-cobalt alloy or iron-nickel-cobalt alloy is preferably used as the solvent metal in the first step.

[Supplement 7]

In the method for manufacturing the synthetic single crystal diamond of the present disclosure, the second step is preferably performed by using electron beam with an irradiation energy of 4.6 MeV or more and 4.8 MeV or less, a current of 2 mA or more and 5 mA or less, and an irradiation time of 30 hours or more and 45 hours or less.

EXAMPLES

The present embodiment will be more specifically described with Examples. However, the present embodiment is not limited by these Examples.

<Sample 1 to Sample 17>

(First Step)

By using a sample chamber that has constitution illustrated in FIG. 1, a diamond single crystal is synthesized by a temperature-difference method that uses a solvent metal.

Iron-cobalt alloy (Fe—Co alloy, ratio of iron to cobalt=45:55 (mass ratio)) is prepared as the solvent metal, and an iron nitride ($Fe_3N$) powder as a nitrogen source is added into the alloy. A concentration of iron nitride in the solvent metal is shown in the column "Iron nitride concentration in solvent metal (mass %)" in "Manufacturing conditions" in Table 1. For example, in Sample 3, the concentration of iron nitride in the solvent metal is 0.01 mass %. In Sample 1 and Sample 2, iron nitride is not added and the concentration of iron nitride in the solvent metal is 0 mass %, but nitrogen with which the solvent metal itself forms a solid solution is contained.

A diamond powder is used for a carbon source, and approximately 0.5 mg of a diamond single crystal is used for a seed crystal. A temperature in the sample chamber is regulated with a heater so that a temperature difference of several tens of degrees is made between a high-temperature portion where the carbon source is disposed and a low-temperature portion where the seed crystal is disposed. This sample is held for 60 hours with regulating a pressure of 5.5 GPa and the temperature in the low-temperature portion of 1370° C.±10° C. (1360° C. to 1380° C.) by using an ultrahigh pressure generator to synthesize a diamond single crystal on the seed crystal.

(Second Step)

Next, the obtained diamond single crystal is irradiated with electron beam. The irradiation conditions of electron beam are set to an irradiation beam energy of 4.6 MeV, a current of 2 mA, and an irradiation time of 30 hours. These are irradiation conditions to apply energy of 100 MGy to the diamond single crystal. In Table 1, samples with described "–" in the column "Electron beam irradiation" in "Second step" in "Manufacturing conditions" are not irradiated with electron beam.

(Third Step)

Then, heat treatment is performed on the diamond single crystal after the first step or the second step in an inert gas (nitrogen gas) under conditions described in the columns "Pressure", "Heat treatment temperature", and "Heat treatment time" in "Third step" in "Manufacturing conditions" in Table 1 to obtain a synthetic single crystal diamond. For example, in Sample 2, the heat treatment is performed on the diamond single crystal in nitrogen gas at 10 Pa and 1700° C. for 60 minutes. In Sample 1, Sample 7, and Sample 12, the heat treatment in the third step is not performed.

[Table 1]

TABLE 1

| | Manufacturing conditions | | | | | |
|---|---|---|---|---|---|---|
| | First step | | | Third step | | |
| Sample No. | Iron nitride concentration in solvent metal (mass %) | Nitrogen-atom concentration in diamond single crystal (ppm) | Second step Electron beam irradiation | Pressure (Pa) | Heat treatment temperature (° C.) | Heat treatment time (min) |
| 1 | 0 | 60 | — | — | — | — |
| 2 | 0 | 60 | 100 MGy | 10 | 1700 | 60 |
| 3 | 0.01 | 150 | 100 MGy | 10 | 1700 | 120 |
| 4 | 0.05 | 500 | 100 MGy | 10 | 1700 | 60 |
| 5 | 0.05 | 500 | 100 MGy | 10 | 1750 | 60 |
| 6 | 0.05 | 500 | 100 MGy | 10 | 1750 | 120 |
| 7 | 0.08 | 800 | — | — | — | — |
| 8 | 0.08 | 800 | — | 10 | 1600 | 60 |
| 9 | 0.08 | 800 | — | 10 | 1700 | 60 |
| 10 | 0.08 | 800 | 100 MGy | 10 | 1700 | 60 |
| 11 | 0.08 | 800 | 100 MGy | 10 | 1850 | 60 |
| 12 | 0.10 | 1000 | — | — | — | — |
| 13 | 0.10 | 1000 | 100 MGy | 10 | 1700 | 60 |
| 14 | 0.10 | 1000 | 100 MGy | 10 | 1700 | 120 |
| 15 | 0.10 | 1000 | 100 MGy | 10 | 1700 | 180 |
| 16 | 0 | 50 | 100 MGy | 10 | 1700 | 60 |
| 17 | 0.12 | 1200 | 100 MGy | 10 | 1700 | 120 |

| | Synthetic single crystal diamond | | | | | |
|---|---|---|---|---|---|---|
| | | Infrared absorption spectrum | | | | |
| Sample No. | Nitrogen-atom concentration (ppm) | Absorption signal (1460 to 1470 $cm^{-1}$) | IA/IB (%) | Isolated substitutional nitrogen atom (ppm) | Raman spectrum $\lambda1 - \lambda2$ ($cm^{-1}$) | {001}<100> Knoop hardness (GPa) |
| 1 | 60 | absence | 0.0 | 60 | −0.30 | 92 |
| 2 | 60 | presence | 0.1 | <10 | −0.20 | 95 |
| 3 | 150 | presence | 0.7 | <10 | −0.10 | 103 |
| 4 | 500 | presence | 7.9 | <10 | 0.10 | 120 |
| 5 | 500 | presence | 1.4 | <10 | 0.02 | 108 |
| 6 | 500 | absence | 0.0 | <10 | −0.10 | 93 |
| 7 | 800 | absence | 0.0 | 800 | −0.17 | 85 |
| 8 | 800 | absence | 0.0 | 600 | −0.20 | 88 |
| 9 | 800 | absence | 0.0 | 540 | −0.10 | 93 |
| 10 | 800 | presence | 1.8 | <10 | 0.05 | 110 |
| 11 | 800 | absence | 0.0 | <10 | 0 | 93 |
| 12 | 1000 | absence | 0.0 | 1000 | −0.46 | 90 |
| 13 | 1000 | presence | 2.0 | <10 | −0.14 | 105 |
| 14 | 1000 | presence | 2.3 | <10 | 0.08 | 117 |
| 15 | 1000 | absence | 0.0 | <10 | −0.05 | 93 |
| 16 | 50 | presence | 0.1 | <10 | −0.15 | 95 |
| 17 | 1200 | presence | 2.5 | <10 | 0.08 | 105 |

<Evaluation>

The synthetic single crystal diamonds of Sample 1 to Sample 17 are subjected to a measurement of a nitrogen-atom concentration, analysis by infrared spectrometry, analysis by Raman spectrometry, a measurement of isolated substitutional nitrogen atoms, and a measurement of a {100}<100> Knoop hardness.

(Measurement of Nitrogen-Atom Concentration)

A nitrogen-atom concentration in the synthetic single crystal diamond of each sample is measured by SIMS. The results are shown in the column "Nitrogen-atom concentration (ppm)" in "Synthetic single crystal diamond" in Table 1.

(Analysis by Infrared Spectrometry)

The synthetic single crystal diamond of each sample is processed into a plate with approximately 1 mm in thickness, two surfaces to transmit light are polished with a metal-bonded grindstone so that a surface roughness Ra is 20 nm or less, and then an infrared absorption spectrum is produced by using an infrared spectrophotometer.

In the infrared absorption spectrum of each sample, presence or absence of an absorption signal within a wavenumber range of 1460 $cm^{-1}$ or more and 1470 $cm^{-1}$ or less is checked. The results are shown in the column "Absorption signal" of "Infrared absorption spectrum" of "Synthetic single crystal diamond" in Table 1. In the column, "presence" represents that the absorption signal is present within the above range. The synthetic single crystal diamond in which the absorption signal is present is determined to have high hardness and excellent wear resistance and breakage resistance. In the column, "absence" represents that the absorption signal is absent within the above range.

In the infrared absorption spectrum of each sample, an absorption intensity IA of the absorption signal within a wavenumber range of 1460 $cm^{-1}$ or more and 1470 $cm^{-1}$ or less and an absorption intensity IB at a wavenumber of 2160 $cm^{-1}$ are measured to calculate a percentage (%) of IA relative to IB. The results are shown in the column "IA/IB (%)" in Table 1.

(Analysis by Raman Spectrometry)

The polished surface of the synthetic single crystal diamond of each sample used in the analysis by the above infrared spectrometry is subjected to Raman spectrometric analysis by using a Raman spectrophotometer to produce a Raman spectrum, and $\lambda 1-\lambda 2$ is calculated. Since the specific measurement method has been described in Embodiment 1, the description is not repeated. The results are shown in the column "$\lambda 1-\lambda 2$ ($cm^{-1}$)" of "Raman spectrum" of "Synthetic single crystal diamond" in Table 1.

(Measurement of Concentration of Isolated Substitutional Nitrogen Atoms)

A concentration of isolated substitutional nitrogen atoms in the synthetic single crystal diamond of each sample is measured by ESR analysis. The results are shown in the column "Isolated substitutional nitrogen atom (ppm)" of "Synthetic single crystal diamond" in Table 1. In Table 1, a case where "<10" is described in the column of the concentration of the isolated substitutional nitrogen atom represents that the concentration of the isolated substitutional nitrogen atoms is below a detection limit. In infrared absorption spectrum of samples in which "<10" is described in the column of the concentration of the isolated substitutional nitrogen atom, checking presence or absence of the absorption peak within a wavenumber range of 1130±2 $cm^{-1}$ confirms that the absorption peak is absent in all the samples. That is, in samples in which "<10" is described in the column of the concentration of the isolated substitutional nitrogen atom, the synthetic single crystal diamond is determined to contain no isolated substitutional nitrogen atom.

(Measurement of Knoop Hardness)

A {001}<100> Knoop hardness of the synthetic single crystal diamond of each sample is measured. Since the specific measurement method has been described in Embodiment 1, the description is not repeated. The results are shown in the column "{001}<100> Knoop hardness" of "Synthetic single crystal diamond" in Table 1. A higher hardness indicates more excellent wear resistance.

<Discussions>

Sample 2 to Sample 5, Sample 10, Sample 13, Sample 14, Sample 16, and Sample 17 correspond to Examples. Sample 1, Sample 6 to Sample 9, Sample 11, Sample 12, and Sample 15 correspond to Comparative Examples. Sample 2 to Sample 5, Sample 10, Sample 13, Sample 14, Sample 16, and Sample 17 (Examples) are confirmed to have higher hardness than Sample 1, Sample 6 to Sample 9, Sample 11, Sample 12, and Sample 15 (Comparative Examples). Furthermore, Sample 2 to Sample 5, Sample 10, Sample 13, Sample 14, Sample 16, and Sample 17 (Examples) have the absorption signal within a wavenumber range of 1460 $cm^{-1}$ or more and 1470 $cm^{-1}$ or less, and thereby determined to have excellent wear resistance and breakage resistance.

The embodiments and Examples of the present disclosure have been described as above, but appropriate combinations and various modifications of the constitution of the above each embodiment and Example are anticipated in advance.

The embodiments and Examples disclosed herein are examples in all the points, and should not be considered to be limitative. The scope of the present invention is described by not the aforementioned embodiments and Examples but the claims, and intended to encompass means equivalent to the claims and all modifications within the scope of the claims.

REFERENCE SIGNS LIST

1 Diamond single crystal; 2 Insulator; 3 Carbon source; 4 Solvent metal; 5 Seed crystal; 6 Pressure medium; 7 Graphite heater; 10 Sample chamber

The invention claimed is:

1. A synthetic single crystal diamond, comprising nitrogen atoms at a concentration of 50 ppm or more and 500 ppm or less in terms of number of atoms, wherein an infrared absorption spectrum of the synthetic single crystal diamond has an absorption signal within a wavenumber range of 1460 $cm^{-1}$ or more and 1470 $cm^{-1}$ or less.

2. The synthetic single crystal diamond according to claim 1, wherein an absorption intensity IA of the absorption signal is 0.1% or more of an absorption intensity IB at a wavenumber of 2160 $cm^{-1}$ in the infrared absorption spectrum.

3. The synthetic single crystal diamond according to claim 1, wherein a Raman shift λ1 $cm^{-1}$ of a peak in a first-order Raman scattering spectrum of the synthetic single crystal diamond and a Raman shift λ2 $cm^{-1}$ of a peak in a first-order Raman scattering spectrum of a synthetic II*a*-type single crystal diamond that has a concentration of nitrogen atoms of 1 ppm or less in terms of number of atoms exhibit a relationship of the following Formula A, $$\lambda 1-\lambda 2 \geq -0.15 \quad \text{Formula A.}$$

4. The synthetic single crystal diamond according to claim 1, wherein a Knoop hardness in a <100> direction on a {001} plane of the synthetic single crystal diamond is 95 GPa or more, and the Knoop hardness is measured in accordance with JIS Z 2251:2009 under conditions of a temperature of 23° C.±5° C. and a test load of 4.9 N.

5. The synthetic single crystal diamond according to claim 1, wherein the synthetic single crystal diamond contains no isolated substitutional nitrogen atom.

6. The synthetic single crystal diamond according to claim 1, wherein the synthetic single crystal diamond comprises the nitrogen atoms within a range of 80 ppm or more and 500 ppm or less in terms of number of atoms.

7. A method for manufacturing the synthetic single crystal diamond according to claim 1, the method comprising:

a first step of synthesizing a diamond single crystal that contains nitrogen atoms at a concentration of 50 ppm or more and 500 ppm or less in terms of number of atoms by a temperature-difference method that uses a solvent metal;

a second step of irradiating the diamond single crystal with one or both of electron beam and particle beam to apply energy of 10 MGy or more and 1000 MGy or less; and a third step of performing heat treatment on the diamond single crystal after the second step, in an inert gas at a pressure of 1 Pa or more and 100 kPa or less to obtain the synthetic single crystal diamond, wherein a temperature "x" in the heat treatment in the third step is 1400° C. or more and 1800° C. or less, a heating time "y" is 1 minute or more and 360 minutes or less, and the temperature "x"° C. and the heating time "y" minutes satisfy the following Formula 1, $$-0.0725x+132 \leq y \leq -0.75x+1410. \qquad \text{Formula 1}$$

8. The method for manufacturing the synthetic single crystal diamond according to claim 7, wherein the solvent metal contains cobalt.

9. The method for manufacturing the synthetic single crystal diamond according to claim 7, wherein in the third step the inert gas is at a pressure of 1 Pa or more and 10 Pa or less.

* * * * *